US004001684B2

United States Statutory Invention Registration [19]

[11] Reg. Number: H1684 de Queiroz et al.

[45] Published: Oct. 7, 1997

[54] FAST PREVIEW PROCESSING FOR JPEG COMPRESSED IMAGES

[75] Inventors: Ricardo L. de Queiroz, Fairport; Reiner Eschbach, Webster, both of N.Y.

[73] Assignee: Xerox Corporation, Stamford, Conn.

[21] Appl. No.: 537,056

[22] Filed: Sep. 29, 1995

[51] Int. Cl.[6] ..... H03M 7/30

[52] U.S. Cl. ..... 382/233; 382/232; 358/261.2

[58] Field of Search ..... 358/261.2, 426, 358/433, 432, 540; 382/250, 248, 244; 348/384, 400, 412, 416, 411, 407, 409; 375/241

[56] References Cited

U.S. PATENT DOCUMENTS

| | | | |
|---|---|---|---|
| 4,999,705 | 3/1991 | Puri | 348/412 |
| 5,001,559 | 3/1991 | Gonzales et al. | 348/400 |
| 5,049,991 | 9/1991 | Niihara | 348/416 |
| 5,321,522 | 6/1994 | Eschbach | 358/433 |
| 5,359,676 | 10/1994 | Fan | 382/246 |
| 5,379,122 | 1/1995 | Eschbach | 358/426 |
| 5,426,673 | 6/1995 | Mitra et al. | 375/241 |
| 5,485,279 | 1/1996 | Yonemitsu et al. | 348/411 |
| 5,521,841 | 5/1996 | Arman et al. | 364/514 A |

OTHER PUBLICATIONS

Chen et al; "Adaptive Coding of Monochrome and Color Images"; IEEE Trans. Comm.; vol. COM-25, No. 11, Nov. 1977; pp. 1285–1292.

*Primary Examiner*—Bernarr E. Gregory
*Attorney, Agent, or Firm*—Mark Costello

[57] ABSTRACT

A method of fast decompressing a document image compressed using transform coding for scaling and previewing purposes. A fast algorithm is derived by utilizing a fraction of all available transform coefficients representing the image. The method is particularly efficient using the discrete cosine transform which is used in the JPEG ADCT algorithm. In JPEG ADCT, a very fast and efficient implementation is derived for a resolution reduction factor of 16 to 1 (4 to 1 in each direction) without needing any floating point arithmetic operations.

6 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FAST PREVIEW PROCESSING FOR JPEG COMPRESSED IMAGES

The present invention is directed to a method of decompressing for previewing or scaling purposes, images compressed in accordance with the currently proposed JPEG ADCT (adaptive discrete cosine transform) standard, and more particularly, a method of providing good quality preview images, without extensive decompression processing.

BACKGROUND OF THE INVENTION

Data compression is required in data handling processes, where too much data is present for practical applications using the data. Commonly, compression is used in communication links, where the time to transmit is long, or where bandwidth is limited. Another use for compression is in data storage, where the amount of media space on which the data is stored can be substantially reduced with compression. A device showing either or both of these cases is a digital copier where an intermediate storage is used for collation, reprint or any other digital copier functions. Additionally, digital copiers often allow the printing of externally received data. Generally speaking, scanned images and print masters, i.e., electronic representations of hard copy documents, are commonly large, and thus are desirable candidates for compression.

ADCT (Adaptive Discrete Cosine Transform, described for example, by W. H. Chen and C. H. Smith, in "Adaptive Coding of Monochrome and Color Images", IEEE Trans. Comm., Vol. COM-25, pp. 1285–1292, November 1977), as the method disseminated by the JPEG committee will be called in this application, is a lossy system which reduces data redundancies based on pixel to pixel correlations. Generally, in images, on a pixel to pixel basis, an image does not change very much. An image therefore has what is known as "natural spatial correlation". In natural scenes, correlation is generalized, but not exact. Noise makes each pixel somewhat different from its neighbors.

Generally, as shown in FIG. 1, a JPEG ADCT compression and decompression system is illustrated. A more complete discussion may be had by referencing U.S. Pat. No. 5,321,522 to Eschbach and U.S. Pat. No. 5,359,676 to Fan. Initially provided is tile memory 10 storing an M×M portion of the image. From the portion of the image stored in tile memory, the discrete cosine transform (DCT), a frequency space representation of the image is formed at transformer 12. Hardware implementations are available, such as the C-Cube Microsystems CL550A JPEG image compression processor, which operates in either the compression or the decompression mode according to the proposed JPEG standard. As will be described below, the primary focus for implementation of the invention is in software processing, although hardware implementations may be improved, as well. A divisor/quantization device 14 is used, from a set of values referred to as a Q-Table, stored in a Q table memory 16, so that a distinct Q table value is divided into the DCT value, returning the integer portion of the value as the quantized DCT value. A statistical encoder 20 often using Huffman codes is used to endcode the quantized DCT values to generate the compressed image that is output for storage, transmission, etc.

ADCT transforms are well known, and hardware exists to perform the transform on image data, e.g., U.S. Pat. No. 5,049,991 to Niihara, U.S. Pat. No. 5,001,559 to Gonzales et at., and U.S. Pat. No. 4,999,705 to Puri. The primary thrust of these particular patents, however, is moving picture images, and not document images.

To decompress the now-compressed image, and with reference to FIG. 1, a series of functions or steps are followed to reverse the process described. Huffman encoding is removed at decoder 50. The image signal now represents the quantized DCT coefficients, which are multiplied at signal multiplier 52 by the Q table values in memory 54 in a process inverse to the compression process. At inverse transformer 56, the inverse transform of the discrete cosine transform is derived, and the output image in the spatial domain is stored at image buffer 58.

In U.S. Pat. No. 5,321,522 and U.S. Pat. No. 5,379,122 to Eschbach, U.S. Pat. No. 5,359,676 to Fan, the standard process described in FIG. 1 is varied. The original image is compressed; the compressed representation is decompressed. The decompressed image is additionally filtered to improve appearance, but in doing so, it may be forced outside the range of images that are possibly derived from the original image. The DCT representation of the image is therefore altered, in order to force the image into the acceptable range of images. The processes may be used iteratively.

Documents are commonly scanned at a resolution that is much higher than standard monitor resolutions. A simple example is a common, inexpensive 300 spi (spots per inch) desktop scanner and a 75 spi monitor. If the document is brought into a document viewer or editor for preview, selection or annotation, the input document has to be reduced in resolution to give the correct representation on the screen. For uncompressed images, this is a straightforward operation, but current and future document systems make use of image compression to improve storage efficiency. In such a case, the document is conventionally decompressed and the resultant image is undersampled. This is a time-consuming operation, since a large amount of data is first generated and then discarded in the downsampling process.

Suppose one has an image scanned at 300 spi and stored in a compressed form using the JPEG process. Suppose it is desired to preview this image, for example, on a 75 spi monitor, at a comparable size. Thus, in theory, one has to decompress the image, filter it to remove possible aliasing in the subsequent subsampling, and subsample it by a factor of 4 in each direction. Such method is clearly very expensive because the image has to be fully decompressed and all the data in the filtering is done in the higher resolution. In prior methods all the data is processed and only 1/16th of the processed data is used. The proposed method only processes 1/16th of the data and uses all of the processed data.

All of the references cited herein above are incorporated by reference for their teachings.

SUMMARY OF THE INVENTION

In accordance with the invention, there is provided an improved method of decompressing an image in a scaled format for preview purposes or applications that require a reduction in image size (e.g. a thumbnail), using a simplified processing method.

In accordance with one aspect of the invention, there is provided a method of decompressing an image, compressed with a frequency space transform operation, for preview purposes, while approximating an accurate reproduction thereof, including the steps of: receiving from a transmission line a set of frequency space transform coefficients, representing a compressed image block of image signals; selecting a subset of said coefficients containing fewer coefficients that said set thereof, said subset corresponding to coefficients for a predetermined group of low frequency components of said image; recovering an image approximation from said subset of coefficients with a frequency space transform operation. In one embodiment, the forward transform coding operation using the frequency space transform operation is a discrete cosine transform of M channels and the inverse is a discrete cosine transform of N channels (N<M).

In accordance with another aspect of the invention, there is provided a method of decompressing an image, compressed with a frequency space transform operation, which is not the inverse operation to the compression transformation, for preview purposes at 4 to 1 reduction, while approximating an accurate reproduction thereof, including the steps of: receiving from a transmission line, an 8×8 set of frequency space transform coefficients, representing a compressed 8×8 image block of image signals; selecting a 2×2 subset of the coefficients, said subset corresponding to coefficients for a predetermined group of low frequency components of the image; recovering an image approximation from the subset of coefficients, in accordance with the function:

$$\begin{bmatrix} x_{00} & x_{01} \\ x_{10} & x_{11} \end{bmatrix} = \frac{1}{8} \begin{bmatrix} 1 & 1 \\ 1 & -1 \end{bmatrix} \begin{bmatrix} y_{00} & y_{01} \\ y_{10} & y_{11} \end{bmatrix} \begin{bmatrix} 1 & 1 \\ 1 & -1 \end{bmatrix}$$

where each x value is a pixel value in the described relative spatial relationship in an set of output image signals; and each y value is a received coefficient value producing an approximation of the image from the coefficients.

The invention provides an alternative method to perform such subsampling in the DCT domain, so that, for JPEG or other coders using 8×8-block DCT, only an inverse 2×2 transform is necessary. This can be done without multiplications and each block is directly reconstructed at the required resolution.

These and other aspects of the invention will become apparent from the following descriptions to illustrate a preferred embodiment of the invention read in conjunction with the accompanying drawings in which.

DETAILED DESCRIPTION OF THE INVENTION

Figure 1:
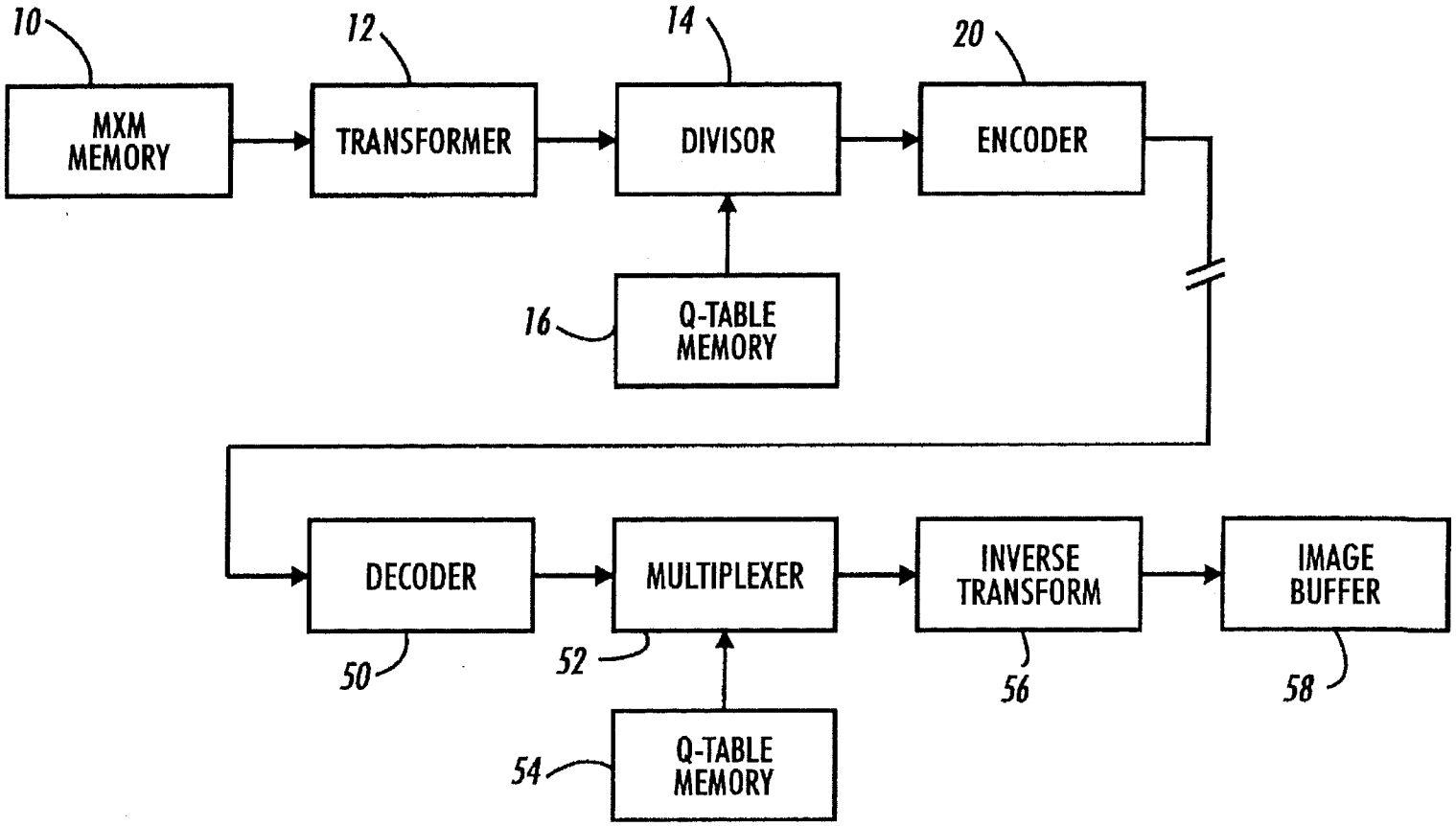
FIG. 1 (Prior Art)
FIG. 1 shows a functional block diagram for the prior art ADCT compression/recompression process.

Referring now to the drawings where the showings are for the purpose of describing an embodiment of the invention and not for limiting same, initially, the principle of the invention will be discussed.

Figure 2:
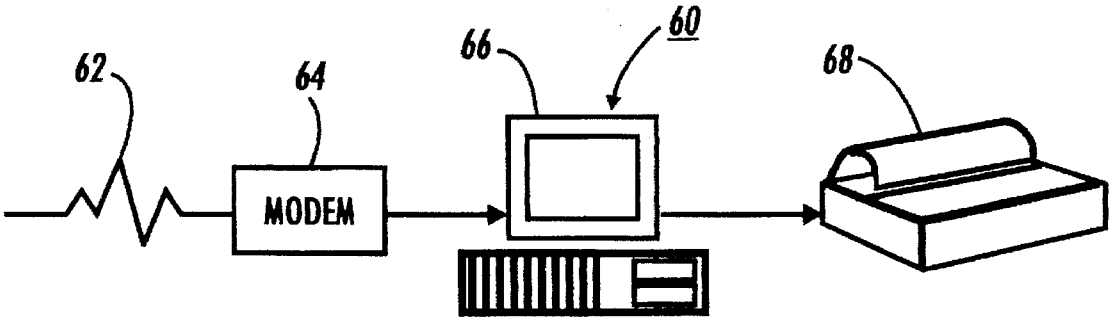
FIG. 2 shows a typical application for the proposed embodiment.

With reference initially to FIG. 2, it will be appreciated the invention may conveniently be included in a workstation or personal computer generally indicated as 60, operating in accordance with a program implementing the method described herein. Conveniently, compressed images are received at personal computer 60 from a transmission line 62, via modem 64. Image received and decompressed may be reproduced at a display 66 associated with workstation 60; at a printer 68 with or without further processing by the workstation at memory associated with the personal computer; or for re-transmission as an uncompressed image.

Figure 3:
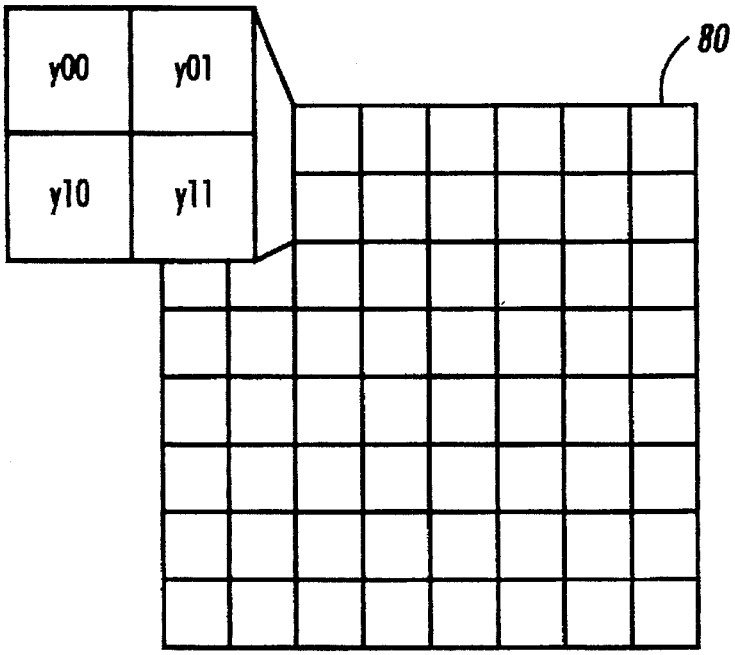
FIG. 3 illustrates the portion of the JPEG ADCT encoded block which is used for the preview decompression process.
Figure 4:
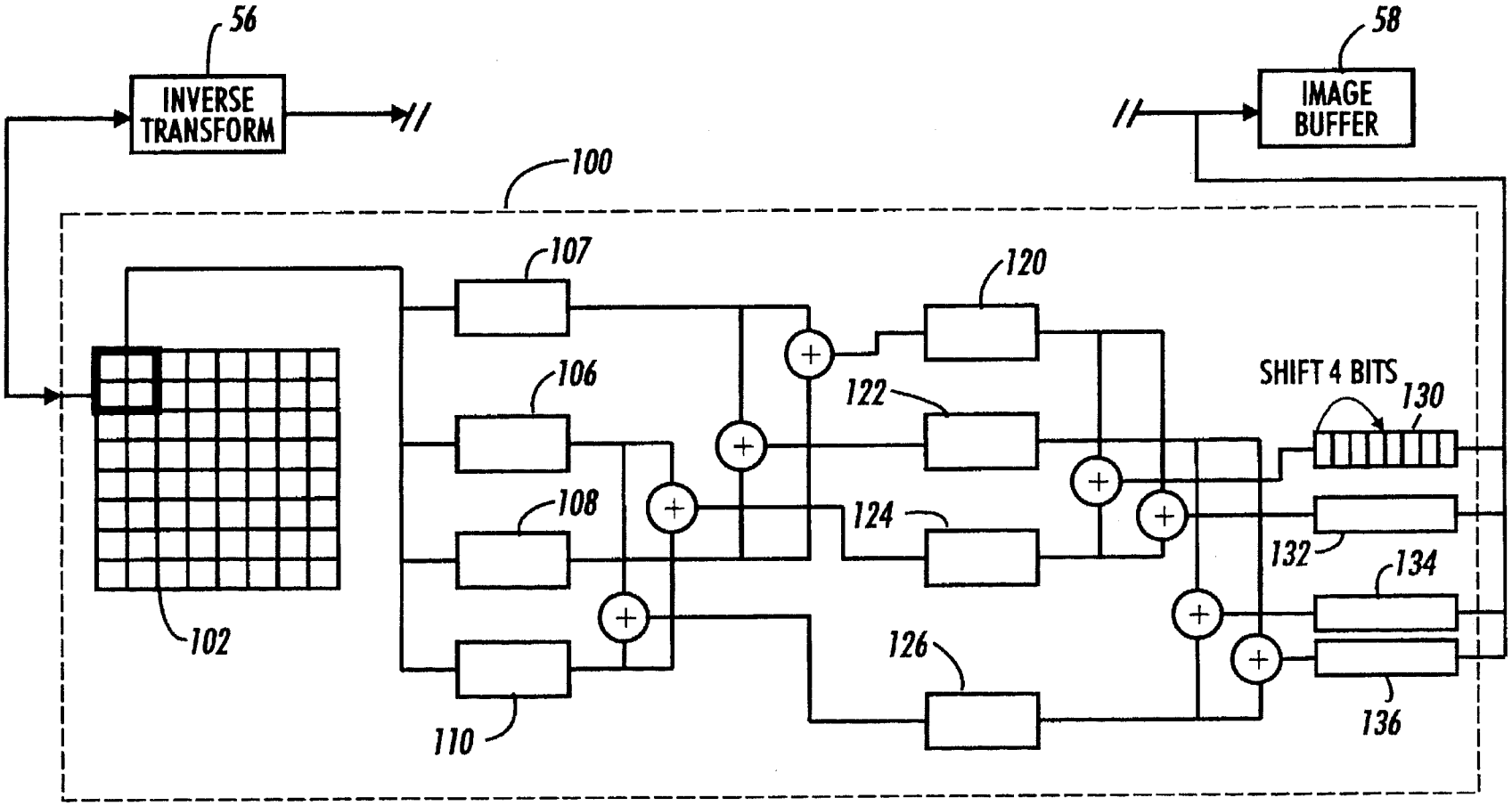
FIG. 4 illustrates a possible circuit configuration for the present invention, and the relationship with the overall processing decompression processing arrangement.

With reference to FIG. 3, in JPEG image transmission, frequency components are transmitted in a predefined order, selected so that the most important frequencies are transmitted before less important frequencies. FIG. 3 shows a somewhat standard 8×8 block of frequency space coefficients 80 that might be received as compressed image data for decompression. Since in most images the most important frequencies are the lowest frequencies, these frequencies indicated are generally transmitted before others, and are also at determinable locations within the data stream of transmitted data.

Let the description for the DCT coefficients in a transformed block of M×M pixels be $$\begin{bmatrix} y_{00} & y_{01} & \cdots & y_{0,M-1} \\ y_{10} & y_{11} & \cdots & y_{1,M-1} \\ \vdots & \vdots & \ddots & \vdots \\ y_{M-1,0} & y_{M-1,1} & \cdots & y_{M-1,M-1} \end{bmatrix}$$

The description of the N×N lowest frequency coefficients is:

$$\begin{bmatrix} y_{00} & y_{01} & \cdots & y_{0,N-1} \\ y_{10} & y_{11} & \cdots & y_{1,N-1} \\ \vdots & \vdots & \ddots & \vdots \\ y_{N-1,0} & y_{N-1,1} & \cdots & y_{N-1,N-1} \end{bmatrix}.$$

The notation for the M×M original pixels in the block is:

$$\begin{bmatrix} x_{00} & x_{01} & \cdots & x_{0,M-1} \\ x_{10} & x_{11} & \cdots & x_{1,M-1} \\ \vdots & \vdots & \ddots & \vdots \\ x_{M-1,0} & x_{M-1,1} & \cdots & x_{M-1,M-1} \end{bmatrix}.$$

The notation for the N×N pixels reconstructed after scaling is:

$$\begin{bmatrix} z_{00} & z_{01} & \cdots & z_{0,N-1} \\ z_{10} & z_{11} & \cdots & z_{1,N-1} \\ \vdots & \vdots & \ddots & \vdots \\ z_{N-1,0} & z_{N-1,1} & \cdots & z_{N-1,N-1} \end{bmatrix}$$

Let the description of the M×M transform matrix (for example the DCT) be given by the matrix Cu and let Du be its inverse. In general we can use $C_n$ and $D_n$ to denote the transform over blocks of n×n pixels. The formulation which describes the transformation process over a block of M×M pixels and generates M×M transformed coefficients is given by:

$$\begin{bmatrix} y_{00} & y_{01} & \cdots & y_{0,M-1} \\ y_{10} & y_{11} & \cdots & y_{1,M-1} \\ \vdots & \vdots & \ddots & \vdots \\ y_{M-1,0} & y_{M-1,1} & \cdots & y_{M-1,M-1} \end{bmatrix} = C_M \begin{bmatrix} x_{00} & x_{01} & \cdots & x_{0,M-1} \\ x_{10} & x_{11} & \cdots & x_{1,M-1} \\ \vdots & \vdots & \ddots & \vdots \\ x_{M-1,0} & x_{M-1,1} & \cdots & xM_{M-1,M-1} \end{bmatrix} C_M^T.$$

Given the coefficients $Y_{ij}$, the prior art steps to find the downscaled block of pixels are:

1) obtain the inverse transform using $$\begin{bmatrix} x_{00} & x_{01} & \cdots & x_{0,M-1} \\ x_{10} & x_{11} & \cdots & x_{1,M-1} \\ \vdots & \vdots & \ddots & \vdots \\ x_{M-1,0} & x_{M-1,1} & \cdots & x_{M-1,M-1} \end{bmatrix} = D_M \begin{bmatrix} y_{00} & y_{01} & \cdots & y_{0,M-1} \\ y_{10} & y_{11} & \cdots & y_{1,M-1} \\ \vdots & \vdots & \ddots & \vdots \\ y_{M-1,0} & y_{M-1,1} & \cdots & y_{M-1,M-1} \end{bmatrix} D_M^T;$$

2) apply a low-pass filtering operation over the reconstructed image;

3) resample the output to obtain the pixels $z_{ij}$.

As can be seen in the above description, all coefficients y are used to generate all output pixels x of which the majority will be discarded in the downsampling.

The proposed method uses a fraction of the coefficients in a block (i.e. N×N coefficients out of the original M×M coefficients) to directly generate the downscaled reconstructed image. We may also include a renormalization multiplicative constant K as:

$$\begin{bmatrix} z_{00} & z_{01} & \cdots & z_{0,N-1} \\ z_{10} & z_{11} & \cdots & z_{1,N-1} \\ \vdots & \vdots & \ddots & \vdots \\ z_{N-1,0} & z_{N-1,1} & \cdots & z_{N-1,N-1} \end{bmatrix} = K \cdot D_N \begin{bmatrix} y_{00} & y_{01} & \cdots & y_{0,N-1} \\ y_{10} & y_{11} & \cdots & y_{1,N-1} \\ \vdots & \vdots & \ddots & \vdots \\ y_{N-1,0} & y_{N-1,1} & \cdots & y_{N-1,N-1} \end{bmatrix} D_N^T$$

If M=8 and N=2

$$\begin{bmatrix} z_{00} & z_{01} \\ z_{10} & z_{11} \end{bmatrix} = K \cdot D_2 \begin{bmatrix} y_{00} & y_{01} \\ y_{10} & y_{11} \end{bmatrix} D_2^T$$

If the elements of $D_8$ are denoted by $\{d_{ij}\}$ we can set K=1 select $D_2$ as any of the following:

$$D_2 = \begin{bmatrix} d_{00} & d_{01} \\ d_{40} & d_{41} \end{bmatrix} D_2 = \begin{bmatrix} d_{10} & d_{11} \\ d_{50} & d_{51} \end{bmatrix}$$

$$D_2 = \begin{bmatrix} d_{20} & d_{21} \\ d_{60} & d_{61} \end{bmatrix} D_2 = \begin{bmatrix} d_{30} & d_{31} \\ d_{70} & d_{71} \end{bmatrix}.$$

This will be equivalent to a filtering in transform domain by setting high-frequency coefficients to zero, followed by subsampling by a factor of 4 in each direction. In this example, one reconstruction formula can be:

$$\begin{bmatrix} z_{00} & z_{01} \\ z_{10} & z_{11} \end{bmatrix} = \begin{bmatrix} d_{00} & d_{01} \\ d_{40} & d_{41} \end{bmatrix} \begin{bmatrix} y_{00} & y_{01} \\ y_{10} & y_{11} \end{bmatrix} \begin{bmatrix} d_{00} & d_{40} \\ d_{01} & d_{41} \end{bmatrix}$$

The problem with this approach is that matrix $D_2$ contains floating point numbers and that we are required to perform floating point multiplications. In this particular example, we have $$\begin{bmatrix} z_{00} & z_{01} \\ z_{10} & z_{11} \end{bmatrix} = \begin{bmatrix} 0.3536 & 0.4904 \\ 0.3536 & -0.0975 \end{bmatrix} \begin{bmatrix} y_{00} & y_{01} \\ y_{10} & y_{11} \end{bmatrix} \begin{bmatrix} 0.3536 & 0.3536 \\ 0.4904 & -0.0975 \end{bmatrix}$$

In the preferred embodiment, we simplify this step by selecting $D_2$ as the inverse 2-channels DCT. The inverse 2-channels DCT is defined by $$D_2 = \frac{1}{\sqrt{2}} \begin{bmatrix} 1 & 1 \\ 1 & -1 \end{bmatrix}$$

A scaling factor can be selected to incorporate K and the multiplicative factors of $D_2$. K is designed to compensate the difference of gain between the 8-channel and the 2-channel DCT (K=⅞) so that $$K \cdot \frac{1}{\sqrt{2}} \cdot \frac{1}{\sqrt{2}} = \frac{2}{8} \cdot \frac{1}{2} = \frac{1}{8}$$

The reconstruction step will require no floating point operations:

$$\begin{bmatrix} z_{00} & z_{01} \\ z_{10} & z_{11} \end{bmatrix} = \frac{1}{8} \cdot \begin{bmatrix} 1 & 1 \\ 1 & -1 \end{bmatrix} \begin{bmatrix} y_{00} & y_{01} \\ y_{10} & y_{11} \end{bmatrix} \begin{bmatrix} 1 & 1 \\ 1 & -1 \end{bmatrix}$$

We can define this as the operation of a specific filter in the subsampling such that the operations of inverse DCT, followed by filtering and decimation are substituted by a more simple integer-only inverse transform, plus a scaling factor for compensating the pixels' range. The scaling factor can be applied as a "shift-right" operation to the reconstructed samples, in integer arithmetic. Therefore, the whole process is free of multiplications and can be done by using 8 additions-subtractions and 4 shift operations, for each block of 2×2 samples.

For example, if we have the following block of 8×8 DCT coefficients:

$$\begin{matrix} 432 & -48 & 0 & 13 & 0 & 0 & 0 & 0 \\ -8 & -18 & -12 & 0 & 0 & 0 & 0 & 0 \\ 30 & 20 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{matrix}$$

The respective 2×2 pixel image approximation scan be determined by $$\frac{1}{8}\begin{bmatrix} 1 & 1 \\ 1 & -1 \end{bmatrix}\begin{bmatrix} 432 & -48 \\ -8 & -18 \end{bmatrix}\begin{bmatrix} 1 & 1 \\ 1 & -1 \end{bmatrix} = \begin{bmatrix} 45 & 61 \\ 51 & 59 \end{bmatrix}$$

The final pixel intensity values were rounded because the factor ⅛ was computed as an integer division by 8. The values given are pixel gray values in a scale of 0–255, from which an image can be derived. This image can be printed, displayed or stored, or processed to a higher number of pixels for a desired visual effect.

FIG. 3 shows a simplified schematic implementation of the present invention. In one possible embodiment, data for the preview is received at a preview decompression device 100, at memory 102. Certain of the information, designated by position in the transmission stream or by storage in memory 102 is directed to as set of registers 104, 106, 108, and 110. The transformation described above is implemented in a series of successive adders/subtractors, whereby values stored in registers 104 and 108 are added and subtracted, with the results respectively directed to registers 120 and 122. Values stored in registers 106 and 110 are added and subtracted, with the results respectively directed to registers 124 and 126. Subsequently the values in registers 120 and 124 are added and subtracted and stored respectively to shift registers 130, 132. The values in registers 122 and 126 are stored respectively to shift registers 134 and 136. At the shift registers, a 3 bits right shift occurs, which accomplished the divide by 8 requirement. The data values can then be output to the image buffer 58 for reproduction.

If we use the formula involving floating point numbers we would obtain:

$$\begin{bmatrix} 0.3536 & 0.4904 \\ 0.3536 & -0.0975 \end{bmatrix}\begin{bmatrix} 432 & -48 \\ -8 & -18 \end{bmatrix}\begin{bmatrix} 0.3536 & 0.3536 \\ 0.4904 & -0.0975 \end{bmatrix} = \begin{bmatrix} 40 & 55 \\ 47 & 56 \end{bmatrix}$$

The generalization of the method is to select $D_N$ as the inverse N-channels DCT and to apply the following formula.

$$\begin{bmatrix} z_{00} & z_{01} & \cdots & z_{0,N-1} \\ z_{10} & z_{11} & \cdots & z_{1,N-1} \\ \cdot & \cdot & \cdot & \cdot \\ \cdot & \cdot & \cdot & \cdot \\ \cdot & \cdot & \cdot & \cdot \\ z_{N-1,0} & z_{N-1,1} & \cdots & z_{N-1,N-1} \end{bmatrix} =$$

-continued $$\frac{N}{M}\cdot D_N \begin{bmatrix} y_{00} & y_{01} & \cdots & y_{0,N-1} \\ y_{10} & y_{11} & \cdots & y_{1,N-1} \\ \cdot & \cdot & \cdot & \cdot \\ \cdot & \cdot & \cdot & \cdot \\ \cdot & \cdot & \cdot & \cdot \\ y_{N-1,0} & y_{N-1,1} & \cdots & y_{N-1,N-1} \end{bmatrix} D_N^T$$

For N>2, floating point numbers may be used. However, always the inherent fast implementation algorithms available for the DCT can be used to fast implement the process, for previewing or scaling purposes.

The embodiment was described in the context of the DCT, however, it should be appreciated that it works for other transforms as well.

The disclosed method may be readily implemented in software. Alternatively, the disclosed image processing system may be implemented partially or fully in hardware using standard logic circuits or specifically on a single chip using VLSI. Whether software or hardware is used to implement the system varies depending on the speed and efficiency requirements of the system and also the particular function and the particular software or hardware systems and the particular microprocessor or microcomputer systems being utilized. The image processing system, however, can be readily developed by those skilled in the applicable arts without undue experimentation from the functional description provided herein together with a general knowledge of the computer arts.

While this invention has been described in conjunction with a preferred embodiment thereof, it is evident that many alternatives, modifications, and variations will be apparent to those skilled in the art. Accordingly, it is intended to embrace all such alternatives, modifications and variations as fall within the spirit and broad scope of the appended claims.

We claim:

1. A method of decompressing an image, compressed with a frequency space transform operation, for preview or scaling purposes, while approximating an accurate reproduction thereof, including the steps of:

receiving from a transmission line or retrieving from memory storage devices a set of frequency space transform coefficients, representing a compressed image block of image signals;

selecting a subset of said coefficients including fewer coefficients than said set thereof, said subset corresponding to coefficients for a predetermined group of low frequency components of said image;

recovering an image approximation with a linear transform relating said subset of coefficients to pixels of the said image approximation.

2. A method as described in claim 1, wherein the forward transform coding operation using the frequency space transform operation is a discrete cosine transform.

3. A method of decompressing an image, compressed with a frequency space transform operation, for preview purposes, while approximating an accurate reproduction thereof, including the steps of:

receiving from a transmission line or retrieving from a memory storage device, a M×M set of frequency space transform coefficients, representing a compressed M×M image block of image signals;

selecting a N×N subset of said coefficients, said subset corresponding to coefficients for a predetermined group of low frequency components of said image;

recovering an image approximation from said subset of coefficients, in accordance with the function:

$$\begin{bmatrix} z_{00} & z_{01} & \cdots & z_{0,N-1} \\ z_{10} & z_{11} & \cdots & z_{1,N-1} \\ \cdot & \cdot & \cdot & \cdot \\ \cdot & \cdot & \cdot & \cdot \\ \cdot & \cdot & \cdot & \cdot \\ z_{N-1,0} & z_{N-1,1} & \cdots & z_{N-1,N-1} \end{bmatrix} = \frac{N}{M} \cdot D_N \begin{bmatrix} y_{00} & y_{01} & \cdots & y_{0,N-1} \\ y_{10} & y_{11} & \cdots & y_{1,N-1} \\ \cdot & \cdot & \cdot & \cdot \\ \cdot & \cdot & \cdot & \cdot \\ \cdot & \cdot & \cdot & \cdot \\ y_{N-1,0} & y_{N-1,1} & \cdots & y_{N-1,N-1} \end{bmatrix} D_N^T$$

where each z value is a pixel value in the described relative spatial relationship in an set of output image signals; each y value is a received coefficient value; and $D_N$ is an N×N inverse transform matrix.

4. A method as described in claim 3, wherein the forward transform coding operation using the frequency space transform operation is a discrete cosine transform of M channels and the inverse transform operation is the discrete cosine transform of N channels.

5. A method of decompressing an image, compressed with a frequency space transform operation, for preview purposes, while approximating an accurate reproduction thereof, including the steps of:

receiving from a transmission line or retrieving from a memory storage device, an 8×8 set of frequency space transform coefficients, representing a compressed 8×8 image block of image signals;

selecting a 2×2 subset of said coefficients, said subset corresponding to coefficients for a predetermined group of low frequency components of said image;

recovering an image approximation from said subset of coefficients, in accordance with the function:

$$\begin{bmatrix} z_{00} & z_{01} \\ z_{10} & z_{11} \end{bmatrix} = \frac{1}{8} \cdot \begin{bmatrix} 1 & 1 \\ 1 & -1 \end{bmatrix} \begin{bmatrix} y_{00} & y_{01} \\ y_{10} & y_{11} \end{bmatrix} \begin{bmatrix} 1 & 1 \\ 1 & -1 \end{bmatrix}$$

where each z value is a pixel value in the described relative spatial relationship in an set of output image signals; and each y value is a received coefficient value.

6. A method as described in claim 5, wherein the forward transform coding operation using the frequency space transform operation is a discrete cosine transform.

* * * * *